United States Patent
Chen et al.

(10) Patent No.: US 10,437,297 B1
(45) Date of Patent: Oct. 8, 2019

(54) AIR JET EMBEDDED CHASSIS

(71) Applicant: QUANTA COMPUTER INC., Taoyuan (TW)

(72) Inventors: Chao-Jung Chen, Taoyuan (TW); Yu-Nien Huang, Taoyuan (TW); Ching-Yu Chen, Taoyuan (TW)

(73) Assignee: QUANTA COMPUTER INC., Taoyuan (TW)

(*) Notice: Subject to any disclaimer, the term of this patent is extended or adjusted under 35 U.S.C. 154(b) by 0 days.

(21) Appl. No.: 15/922,625

(22) Filed: Mar. 15, 2018

(51) Int. Cl.
*G06F 1/20* (2006.01)
*G06F 1/18* (2006.01)
*H05K 7/20* (2006.01)

(52) U.S. Cl.
CPC .............. *G06F 1/20* (2013.01); *G06F 1/181* (2013.01); *G06F 1/187* (2013.01); *H05K 7/20* (2013.01); *H05K 7/20136* (2013.01); *H05K 7/20145* (2013.01)

(58) Field of Classification Search
None
See application file for complete search history.

(56) References Cited

U.S. PATENT DOCUMENTS

| | | | | |
|---|---|---|---|---|
| 4,417,295 A | * | 11/1983 | Stuckert | H05K 7/20 165/123 |
| 5,428,503 A | * | 6/1995 | Matsushima | H05K 7/20154 165/908 |
| 6,208,510 B1 | * | 3/2001 | Trudeau | H05K 7/20609 165/80.3 |
| 2007/0097634 A1 | * | 5/2007 | Chang | G06F 1/20 361/695 |
| 2007/0119573 A1 | * | 5/2007 | Mahalingam | F28F 13/02 165/80.4 |
| 2007/0236881 A1 | * | 10/2007 | Harder | H05K 7/202 361/695 |
| 2010/0097760 A1 | * | 4/2010 | Azar | H01L 23/4735 361/695 |

FOREIGN PATENT DOCUMENTS

| | | |
|---|---|---|
| CN | 1947481 A1 | 4/2007 |
| TW | 201448710 A | 12/2014 |

OTHER PUBLICATIONS

TW Office Action for Application No. 107116856, dated Nov. 20, 2018, w/ First Office Action Summary.
TW Search Report for Application No. 107116856, dated Nov. 20, 2018, w/ First Office Action.

* cited by examiner

*Primary Examiner* — Mukundbhai G Patel
*Assistant Examiner* — Zhengfu J Feng
(74) *Attorney, Agent, or Firm* — Nixon Peabody LLP; Zhou Lu

(57) ABSTRACT

A chassis having embedded air jets for cooling a computer device is disclosed. The chassis includes a pair of side walls defining a front end and a rear end. The chassis includes a bottom plate for mounting an electronic component. Ducts are supported by each of the side walls. The ducts include a front opening and a rear opening. Two static fans are coupled to the rear openings of the ducts. A nozzle frame is located at the front end of the chassis. The nozzle frame includes a lateral nozzle bar emitting an air jet generated from the front openings of the ducts.

15 Claims, 4 Drawing Sheets

FIG. 1
(PRIOR ART)
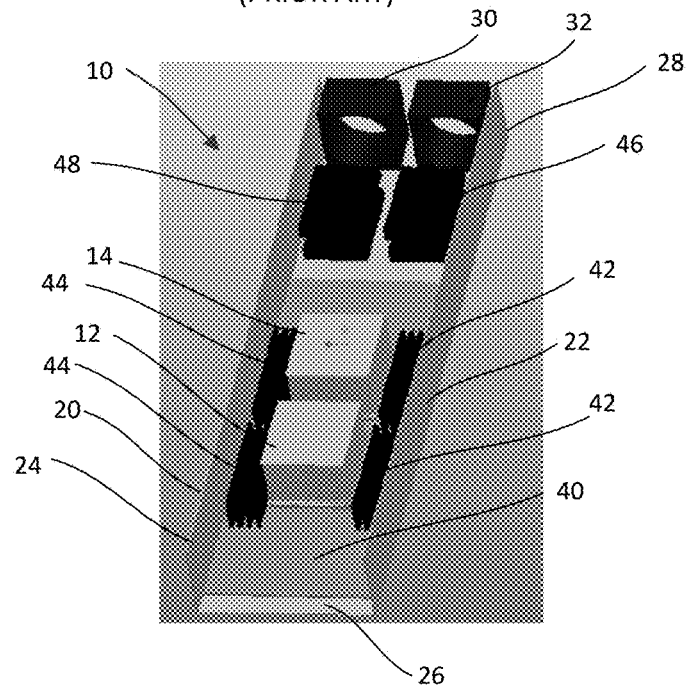
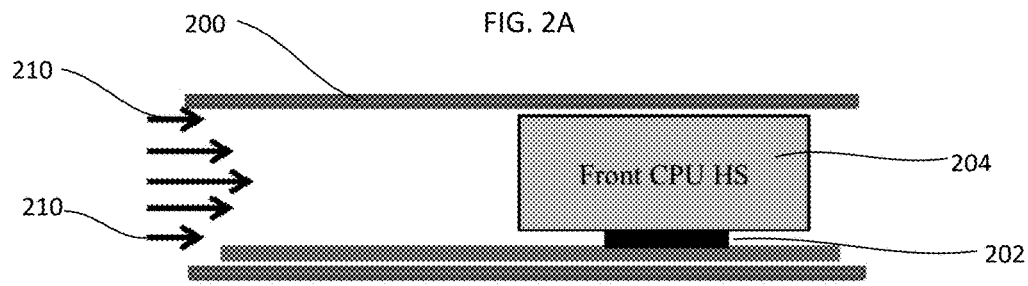
FIG. 2A
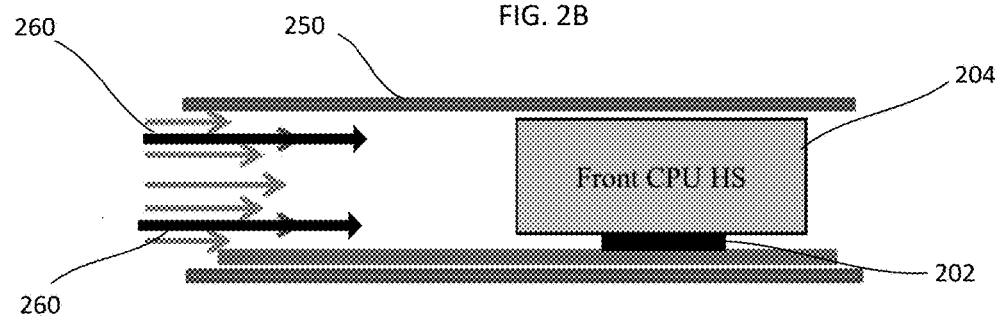
FIG. 2B

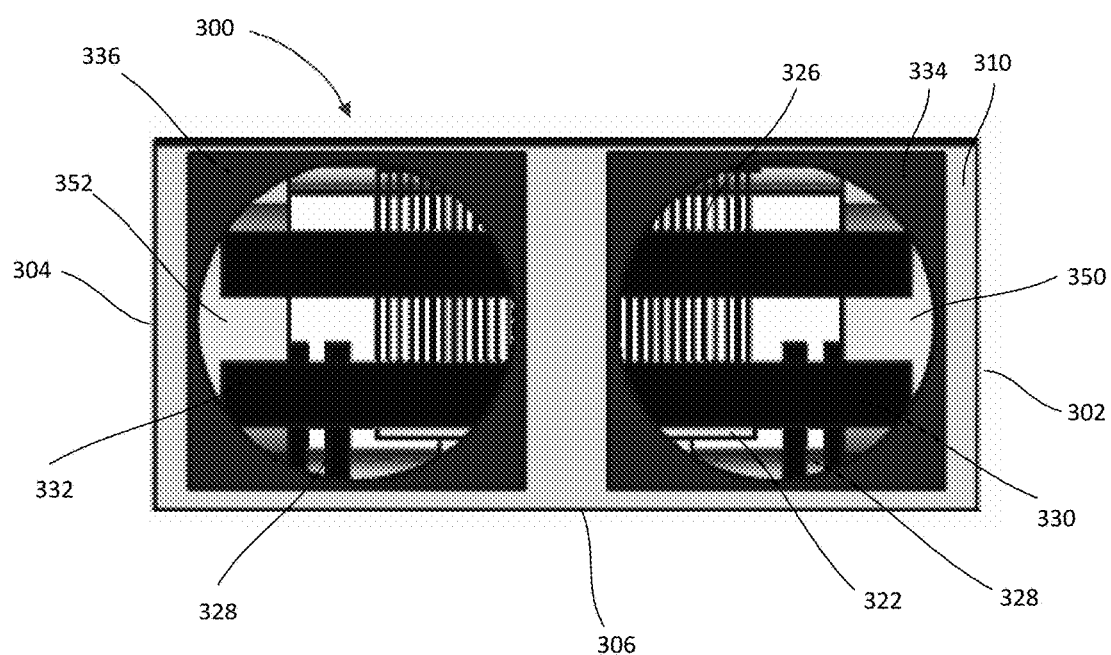

AIR JET EMBEDDED CHASSIS

TECHNICAL FIELD

The present disclosure relates generally to an efficient chassis for cooling an electronic device. More particularly, aspects of this disclosure relate to an air jet structure embedded in a chassis for cooling an electronic device.

BACKGROUND

Electronic devices such as servers include electronic components that are connected to a power supply. Servers generate an enormous amount of heat due to the operation of internal electronic devices such as controllers, processors, and memory. Overheating from the inefficient removal of such heat has the potential to shut down or impede the operation of such devices. Thus, servers are designed to rely on air flow through the interior of the device to carry away heat generated from electronic components. Servers often include various heat sinks that are attached to the electronic components such as processing units. Heat sinks are typically composed of thermally conductive material. Heat sinks absorb the heat from the electronic components, thus transferring the heat away from the components. The heat from heat sinks must be vented away from the server. Airflow to vent away such heat is often generated by a fan system that accelerates airflow through the components and the heat sink. The generated airflow thus carries collected heat away from the components and the heat sink.

In devices such as servers, the system power is limited by the thermal design for cooling such components. Thus, the operating velocity of such devices is constrained by the thermal design, as components must sometimes be run at lower velocities so they don't overheat. By the principles of energy conversation, the power limitation of a fan cooled device is proportional to the air quantity flowing through the device. The greater the air quantity, the more air flow is available for cooling, and therefore the power, (and therefore performance) of the system may be increased. High system power allows higher power to components such as a CPU. Higher power allows more efficient operation of the CPU and thus results in increased calculation speed.

FIG. 1 is a perspective view of a traditional chassis design of a half node server 10. The server 10 includes two CPUs 12 and 14 in "shadow placement" in a chassis 20. The CPUs 12 and 14 are mounted on heat sinks (not shown) that conduct heat generated by the CPUs 12 and 14. The chassis 20 includes two side walls 22 and 24. The side walls 22 and 24 define a front opening 26 and a back wall 28. The back wall 28 mounts two system cooling fans 30 and 32. Air passes through from the front opening 26 of the chassis 20 to the back wall 28. In FIG. 1, air flow is generated by the two system fans 30 and 32.

The front of the chassis 20 includes a space 40 for different component cards, such as PCIE compatible cards, that may be inserted in slots (not shown). In this example, the CPUs 12 and 14 are arranged in tandem between the side walls 22 and 24. The chassis 20 holds double data rate (DDR) SRAM memory devices 42 and 44 in proximity to the CPUs 12 and 14. The SRAM memory devices 42 and 44 are arranged in slots to allow openings between them for air to flow through the chassis 20. Two large capacity memory devices 46 and 48 are mounted in proximity to the fans 30 and 32. In this example, the memory devices 46 and 48 may be hard disk drives or solid state drives.

Heat is generated by the operation of the CPUs 12 and 14, the SRAM memory devices 42 and 44, and the memory devices 46 and 48. Air flow generated by the fans 30 and 32 is used to cool these devices. The cooling efficiency depends on the air quantity moving through the chassis 20. In traditional chassis designs such as that in FIG. 1, there are two ways to increase air quantity and thus cooling. One way is to increase the velocity of the fans 30 and 32, thus increasing air flow. Another way is to reduce the number of components contained in the chassis 20, thus reducing system air impedance. However, increasing fan velocity is not effective when the fan is placed nearby components such as the hard disk drives 46 and 48. Such barriers in front of the fan cause more vortices near fan inlet portion. Thus, when the fan speed is increased, the vortices will be close to the fan inlet and decrease fan efficiency. Further, removal of components, such as one of memory devices 46 or 48 or a CPU 12 or 14, reduces the capabilities of the device.

Thus, there is a need for a computer device chassis that maximizes the quantity of air flow for cooling components. There is another need for nozzle structures to inject higher velocity air in the front of a computer device chassis to assist in cooling. There is also a need for a chassis design that allows the use of high pressure fans and ducts to generate air jets.

SUMMARY

One disclosed example is a chassis for a computer device. The chassis has a pair of side walls defining a front end and a rear end. The chassis includes a bottom plate for mounting an electronic component. A duct is located on one of the side walls. The duct includes a front opening and a rear opening. A fan is coupled to the rear opening of the duct. A nozzle frame is mounted at the front end of the chassis. The nozzle frame is coupled to the front opening of the duct. The nozzle frame includes one or more air jet openings configured to emit at least one air jet at the front end, towards the rear end of the chassis.

Another example is an electronic device having a chassis with two side walls defining a front end and a rear end. A duct is located on one of the side walls. The duct includes a front opening and a rear opening. A static fan is coupled to the rear opening of the duct. An electronic component is mounted in the chassis. A nozzle frame is mounted at the front end of the chassis. The nozzle frame is coupled to the front opening of the duct. The nozzle frame includes one or more air jet openings configured to emit at least one air jet at the front end toward the rear end of the chassis.

Another example is a computer device including a chassis having two side walls defining a front end and a rear end. Each of the side walls support a duct including a front opening and a rear opening. An electronic component is mounted in the chassis between the ducts. A static fan is coupled to the rear opening of each of the ducts. A nozzle frame is located at the front end of the chassis. The nozzle frame includes two side tubes. Each of the side tubes is coupled to receive air from one of the ducts. A top nozzle bar is coupled to one end of the two side tubes. The top nozzle bar emits a top air jet. A bottom nozzle bar is coupled to the opposite end of the two side tubes. The bottom nozzle bar emits a bottom air jet.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which:

FIG. 1 is a perspective view of a prior art chassis design;

FIGS. 2A and 2B are cutaway view of a chassis schematically illustrating air flow distribution before and after enhancing cooling with additional jets;

FIG. 4 is a rear view of the example chassis in FIGS. 2A-2B;

Figure 3:
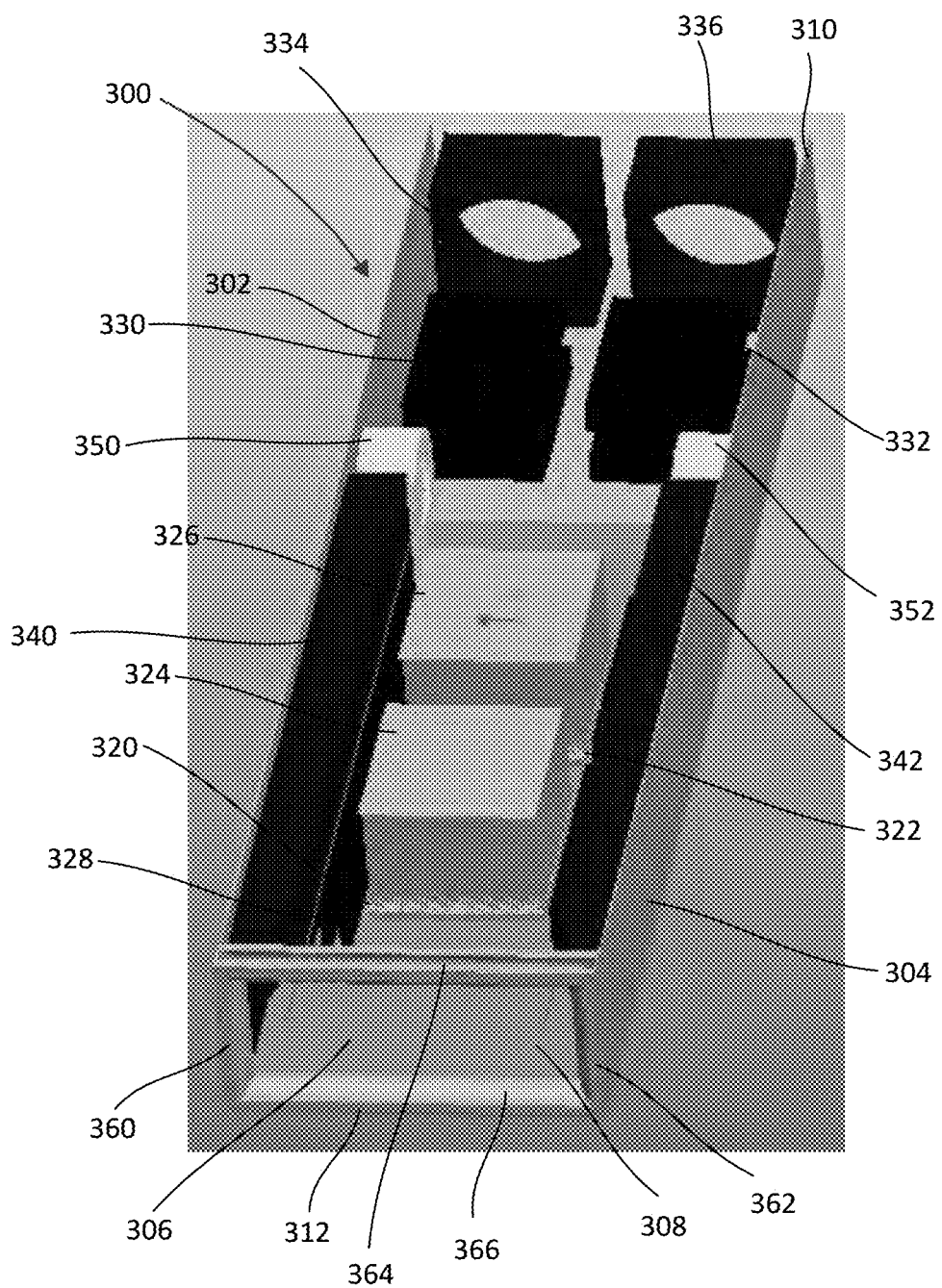
FIG. 3 is a perspective cutaway view of an example chassis that includes air jet structures to increasing cooling efficiency.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION OF THE
ILLUSTRATED EMBODIMENTS

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at, near, or nearly at," or "within 3-5% of," or "within acceptable manufacturing tolerances," or any logical combination thereof, for example.

By considering the property of air viscosity, if local air velocity in the front opening area of a chassis may be increased, more outer air goes through the front opening of the chassis. This increases the cooling of the components in the chassis. FIGS. 2A-2B are air flow diagrams for a chassis before and after enhancing cooling with the air jets, FIG. 2A shows a cross-section side view of a first, traditional chassis configuration 200 with air flow distribution arrows 210 schematically illustrating the distribution of air flow velocities through the chassis configuration 200. In the air flow distribution arrows 210, longer arrows represent higher relative velocities. As shown in by the air flow distribution arrows 210, lower air velocities are present closer to the walls of the chassis configuration 200, and higher air velocities are present away from such walls. Thus, the air flow distribution arrows 210 limit the volume of air passing through the chassis configuration 200. This can be significant for cooling considerations of an electronic component, such as a CPU 202, attached to a heat sink 204 on the top surface of CPU 202. In particular, this effectively limits the amount of cooling possible in the chassis configuration 200. Thus, even if the fans were replaced with higher velocity fans, the full benefit of the higher velocity fans would not be realized in the chassis configuration 200.

In view of such a fundamental limitation, the present disclosure contemplates a methodology for improving cooling by altering the airflow distribution. This is schematically illustrated in FIG. 2B. FIG. 2B shows a second chassis configuration 250 in which air flow distribution arrows 260 schematically illustrate an improved distribution of airflow velocities through the chassis configuration 250. In comparison to air flow distribution arrows 210 in FIG. 2A, the present disclosure contemplates configuring the airflow distribution arrows 260 in the chassis configuration 250 to have relatively high airflow velocities closer to the walls of the chassis configuration 250. When such an increase in airflow velocity is produced (as shown by the air flow distribution arrows 260), the volume of air going through the second chassis configuration 250, and particularly CPU 202, is effectively increased. The increased volume of air results in more efficient cooling of components, including the CPU 202. An exemplary configuration for providing such increased air volume is described below.

FIG. 3 shows a perspective view of an example chassis 300 for a computer device with enhanced cooling. FIG. 4 shows a rear view of the example chassis 300 in FIG. 3. The chassis 300 includes two side walls 302 and 304 that are connected to a bottom plate 306. Various electronic components are mounted on the bottom plate 306. The chassis 300 includes a power supply unit (not shown) that provides power to the electronic components. The device chassis 300 has a front end 308 and a rear end 310. The front end 308 is defined by a nozzle frame 312. As will be explained below, the nozzle frame 312 provides high velocity air jets at the top and the bottom of the chassis 300 to assist in cooling the electronic components.

The device chassis 300 mounts a front CPU 320 and a rear CPU 322 in a tandem arrangement. In this example, the computer device has two CPUs, but it is understood that there may be any number of CPUs or other controllers that may be mounted in the chassis 300. The CPUs 320 and 322 are in contact with heat sinks 324 and 326 that are mounted over the CPUs 320 and 322 respectively. The heat sinks 324 and 326 conduct heat generated by the CPUs 320 and 322. The CPUs 320 and 322 are in proximity to double data rate (DDR) static random access memory (SRAM) cards 328. The SRAM cards 328 are mounted in parallel slots near the side walls 302 and 304 next to the CPUs 320 and 322. Two groups of large capacity memory devices 330 and 332 are mounted in proximity to fans 334 and 336. In this example, the memory devices in the groups of memory devices 330 and 332 may be hard disk drives or solid state drives. The fans 334 and 336 generate air flow from the front end 308 of the device chassis 300 to the rear end 310 of the chassis.

The side walls 302 and 304 each support a respective side air duct 340 and 342. As shown in FIG. 3, the air ducts 340 and 342 extend from the rear CPU 322 to the front end 308 of the chassis 300. The air ducts 340 and 342 each are connected to respective high static pressure fans 350 and 352. The high static pressure fans 350 and 352 are located in back of the rear CPU 322. The high static pressure fans 350 and 352 create high pressure air flow that is conducted by the side air ducts 340 and 352 to the air nozzle frame 312. The nozzle frame 312 guides the high pressure air generated by the high static pressure fans 350 and 352 to create air jets flowing from the front end 308. The air jets increase the velocity of the air flowing from the front end 308 toward the rear end 310 of the chassis 300. The air jets at the top and the bottom of the nozzle frame 312 are represented by the longest airflow distribution arrows 260 in FIG. 2.

In the configuration of FIG. 3, the high static pressure fans 350 and 352 are configured to recycle airflow. That is, the high static pressure fans 350 and 352 are configured to draw air from the space between CPU 322 and memory devices 330 and 332, and direct such air through air ducts 340 and 342. However, in some configurations, if cooler air is needed, the side walls 302 and 304 can have openings to allow the high static pressure fans 350 and 352 to draw cooler air from an exterior of chassis 300. Additionally, the present disclosure also contemplates that air can be drawn from both the interior and the exterior of the chassis 300.

In configurations where airflow is being recycled, the high static pressure fans 350 and 352 can be strategically located to ensure that cooler air is injected via the nozzle frame 312. In particular, these fans can be located in areas of chassis 300 likely to contain cooler air. For example, air that has passed though CPUs 320 and 322, and is likely to be relatively hotter than air that has passed through SRAM cards 328. Thus, the high static pressure fans 350 and 352 can be located in chassis 300 so as to primarily draw from the air that has passed through SRAM cards 328. However, the present disclosure contemplates that air can be drawn from any portion inside chassis 300. Alternatively, rather than locating the high static pressure fans 350 and 352 in a particular location, additional air ducts or other air directing features can be added to connect the inlet of high static pressure fans 350 and 352 to areas of cooler air.

As shown in FIG. 3, the nozzle frame 312 includes two hollow side tubes 360 and 362 that are connected to the air flowing through the air ducts 340 and 342 respectively. The hollow side tubes 360 and 362 are connected to a top nozzle bar 364 and a bottom nozzle bar 366. The top and bottom nozzle bars 364 and 366 emit air jets at the top and the bottom of the front end 308 of the chassis 300.

Figure 5A:
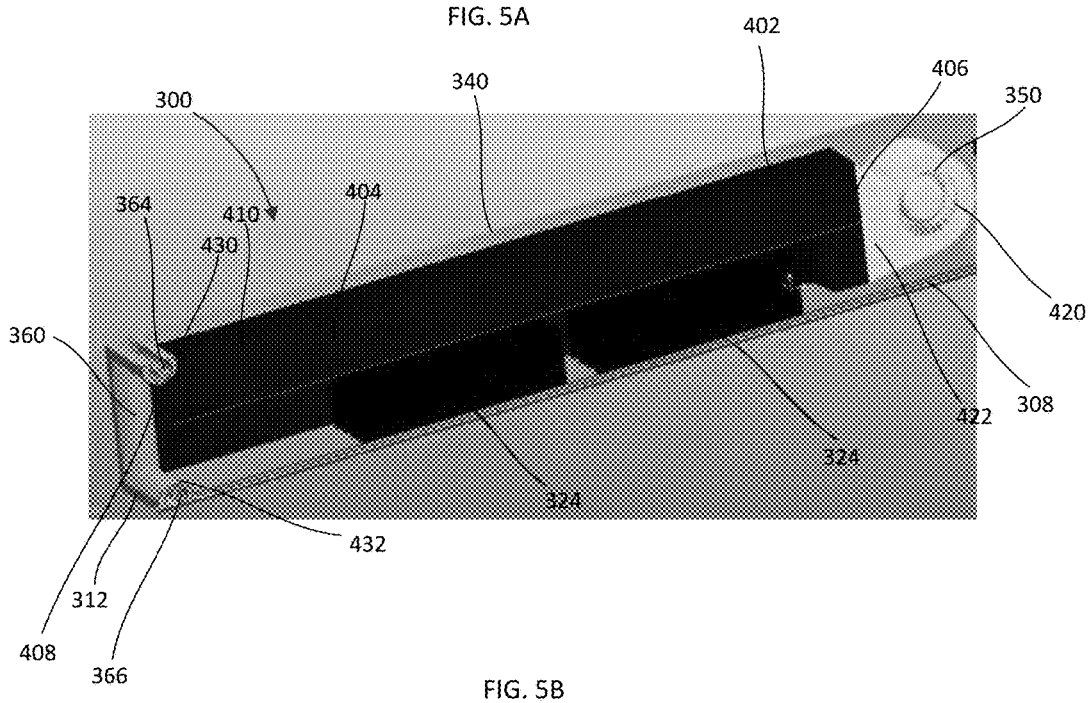
FIG. 5A is a perspective view of the side wall of the example chassis in FIG. 3.

FIG. 5A is a close-up perspective view of the side air duct 340 (in FIG. 3). Like element numbers in FIG. 5A designate like elements in FIG. 3. The side air duct 340 has a top wall 402 and a side wall 404 that define a rear opening 406 and a front opening 408. The rear opening 406 is shaped to guide the air flow that is generated by the high static pressure fan 350. The air flow is therefore guided from the rear opening 406 through the length of the top and side walls 402 and 404 to the front opening 408. A tapered wall 410 forms the slimmer front opening 408. The front opening 408 is coupled to the side tube 360 of the nozzle frame 312. The high static pressure fan 350 includes a motor 420 that rotates fan blades to generate air flow. The fan 350 has an outlet 422 having a rectangular shape that funnels the air flow generated by the motor 420. The outlet 422 mates with the rear opening 406 of the air duct 340.

The top nozzle bar 364 includes a lateral air jet slot 430 that emits a high velocity air jet at the top of the front end 308 of the chassis 300. The lateral air jet slot 430 extends approximately between the side walls 302 and 304. The bottom nozzle bar 366 includes a lateral air jet slot 432 that emits a high velocity air jet at the bottom of the front end 308 of the chassis 300. The lateral air jet slot 432 extends approximately between the side walls 302 and 304 (in FIG. 3).

Figure 5B:
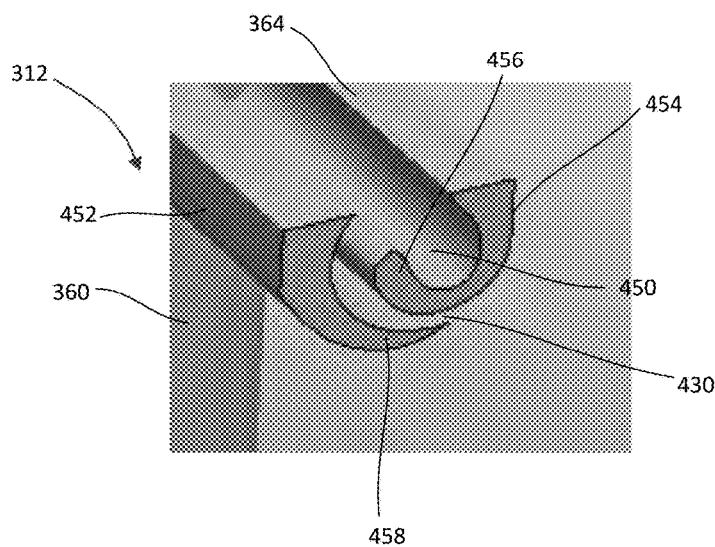
FIG. 5B is a perspective close-up view of the top nozzle of the nozzle frame in the example chassis shown in FIG. 3.

FIG. 5B shows a cutaway close up view of the top nozzle bar 364 and the side tube 360. The top nozzle bar 364 includes a conduit 450 that receives the air flow from the side tube 360. The conduit 450 is formed by a front wall 452 and a rear wall 454. The rear wall 454 supports a curved member 456 that guides the air to the air jet slot 430. The front wall 452 supports a curved flap 458. The curved member 456 and the curved flap 458 are spaced apart and define the air jet slot 430. Air flows through the conduit 450 from the side tubes 360 and 362 in FIG. 3. The air is forced over the curved member 456 and through the air jet slot 430. To provide an air jet, the spacing between curved member 456 and curved flap 458 taper to air jet slot 430. The structure of the bottom nozzle bar 366 in FIG. 5A is similarly configured to the components of the top nozzle bar 364 shown in FIG. 5B.

FIGS. 3, 4, 5A and 5B show the air jet embedded chassis 300 that includes three features that increase air flow to the electronic components in the chassis 300. First, the chassis 300 includes two high static pressure fans 350 and 352. Second, the chassis 300 includes the nozzle frame 312 on the front end 308 with a nozzle structure formed in by the top nozzle bar 464 and the bottom nozzle bar 466. Third, the air ducts 340 and 342 guide air moving from the high static pressure fans 350 and 352 to the nozzle frame 312. When the high static pressure fans 350 and 352 move air through the air ducts 340 and 342 to the nozzle frame 312, the cross-sectional area of the nozzle frame 312 gets smaller along the air flow direction. Thus, air velocity is increased when air passes from the air ducts 340 and 342 to the nozzle structure formed by the nozzle frame 312. The fast air jets from the slots 430 and 432 will move more air from the front end 308 of the chassis 300 because of air viscosity as shown by the airflow distribution arrows 260 (in FIG. 2A). The resulting increase in quantity of air increases the cooling capability of the chassis 300.

Although the example chassis in FIGS. 3, 4, 5A and 5B shows a specific configuration for providing air jets, this is solely for ease of illustration. The present disclosure also contemplates that other configurations for providing air jets can be provided. For example, the nozzle frame 312 has the slots 430 and 432 that substantially extend between side walls 302 and 304. However, in other configurations, these slots can be a series of slots, nozzles, or any other features for injecting air into the device chassis.

Moreover, although FIGS. 3, 4, 5A and 5B show a particular arrangement of static fans, ducts, and nozzle frame, the present disclosure contemplates that other configurations are possible. For example, the static fans can be located anywhere in the chassis, and the duct can be configured to extend through the chassis, as needed, to reach the nozzle frame. In some cases, the duct can be a flexible hose or the like, coupling the output of the static fan to the nozzle frame. In another example, although the exemplary nozzle frame is shown as a relatively unitary component, in other configurations the nozzle frame can be composed of a set of different components. Additionally, although the exemplary configuration calls for a high static pressure fans, any other type of fan can be used in the various configurations.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

The terminology used herein is for the purpose of describing particular embodiments only, and is not intended to be limiting of the invention. As used herein, the singular forms "a", "an" and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A chassis for a computer device, comprising:
   a pair of side walls defining a front end and a rear end;
   a bottom plate for mounting an electronic component;
   a duct on one of the side walls, the duct including a front opening and a rear opening;
   a fan coupled to the rear opening of the duct; and
   a nozzle frame at the front end of the chassis and coupled to the front opening of the duct, the nozzle frame including one or more air jet openings configured to emit at least one air jet at the front end towards the rear end, wherein the nozzle frame includes a top nozzle bar and a bottom nozzle bar, each of the nozzle bars including at least one of the one or more air jet openings.

2. The chassis of claim 1, further comprising:
   another duct on the other of the side walls, the another duct including a front opening and a rear opening; and
   another fan coupled to the rear opening of the another duct, and wherein the nozzle frame is coupled to the front opening of the another duct.

3. The chassis of claim 1, wherein the nozzle frame includes a side tube connected to the front opening of the duct.

4. The chassis of claim 1, wherein the top nozzle bar is located laterally at the top of the side walls, and wherein the bottom nozzle bar is located laterally at the bottom of the side walls.

5. The chassis of 1, where the electronic component is one of a CPU or a hard storage device.

6. The chassis of claim 1, further comprising a cooling fan at the rear end of the chassis.

7. The chassis of claim 1, wherein the one or more air jet openings are one or more lateral slots.

8. An electronic device comprising:
   a chassis having two side walls defining a front end and a rear end, a duct on one of the side walls, the duct including a front opening and a rear opening;
   a static fan coupled to the rear opening of the duct;
   an electronic component mounted in the chassis; and
   a nozzle frame at the front end of the chassis and coupled to the front opening of the duct, the nozzle frame including one or more air jet openings configured to emit at least one air jet at the front end towards the rear end of the chassis, wherein the nozzle frame includes a top nozzle bar and a bottom nozzle bar, each of the nozzle bars including at least one of the one or more air jet openings.

9. The electronic device of claim 8, further comprising:
   another duct on the other of the side walls, the another duct including a front opening and a rear opening; and
   another fan coupled to the rear opening of the another duct, and wherein the nozzle frame is coupled to the front opening of the another duct.

10. The electronic device of claim 8, wherein the nozzle frame includes a side tube connected to the front opening of the duct.

11. The electronic device of claim 8, wherein the top nozzle bar is located laterally at the top of the side walls, and wherein the bottom nozzle bar is located laterally at the bottom of the side walls.

12. The electronic device of claim 8, where the electronic component is one of a CPU or a hard storage device.

13. The electronic device of claim 8, further comprising a cooling fan at the rear end of the chassis.

14. The electronic device of claim 8, wherein the one or more air jet openings are one or more lateral slots.

15. A computer device comprising:
   a chassis having two side walls defining a front end and a rear end, each of the side walls supporting a duct including a front opening and a rear opening;
   an electronic component mounted in the chassis between the ducts;
   a static fan coupled to the rear opening of each of the ducts; and
   a nozzle frame at the front end of the chassis, the nozzle frame including two side tubes, each coupled to receive air from one of the ducts, and a top nozzle bar coupled to one end of the two side tubes, the top nozzle bar emitting a top air jet, and a bottom nozzle bar coupled to the opposite end of the two side tube, the bottom nozzle bar emitting a bottom air jet.

* * * * *